(12) United States Patent
Kondo

(10) Patent No.: US 6,297,680 B1
(45) Date of Patent: Oct. 2, 2001

(54) INTERNAL CLOCK GENERATOR THAT MINIMIZES THE PHASE DIFFERENCE BETWEEN AN EXTERNAL CLOCK SIGNAL AND AN INTERNAL CLOCK SIGNAL

(75) Inventor: Takako Kondo, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 09/540,748

(22) Filed: Mar. 31, 2000

(30) Foreign Application Priority Data

Mar. 31, 1999 (JP) .................................. 11-091590
Feb. 25, 2000 (JP) .................................. 12-049695

(51) Int. Cl.[7] .................................................. H03H 11/26
(52) U.S. Cl. .................... 327/278; 327/276; 327/291
(58) Field of Search ............................ 327/116, 119–122, 327/158, 161, 291, 261, 270–272, 276–278

(56) References Cited

U.S. PATENT DOCUMENTS

| 4,165,490 | * | 8/1979 | Howe, Jr. et al. ................. 327/172 |
| 4,805,195 | * | 2/1989 | Keegan ................................ 375/106 |
| 5,349,612 | | 9/1994 | Gao et al. . |
| 5,552,726 | * | 9/1996 | Wichman et al. .................. 327/149 |
| 6,049,239 | * | 4/2000 | Eto et al. ............................ 327/149 |
| 6,075,415 | * | 6/2000 | Milton et al. ...................... 327/119 |

FOREIGN PATENT DOCUMENTS

| 10013395 | 1/1968 | (JP) . |
| 6-61773 | 3/1994 | (JP) . |
| 07098617 | 4/1995 | (JP) . |
| 08171781 | 7/1996 | (JP) . |

* cited by examiner

*Primary Examiner*—Kenneth B. Wells
(74) *Attorney, Agent, or Firm*—Venable; Robert P. Frank

(57) ABSTRACT

An internal clock generation circuit according to the present invention includes a phase comparator, a shift register, a filter, a monitor circuit, and a plurality of delay lines such as first and second delay lines. The first delay line has delay steps each larger than that of the second delay line. The first delay line is first used to generate a clock minimized in phase difference with respect to an external clock. The clock signal is inputted to the second delay line to perform fine adjustment to the phase difference.

13 Claims, 16 Drawing Sheets

INTERNAL CLOCK GENERATOR THAT MINIMIZES THE PHASE DIFFERENCE BETWEEN AN EXTERNAL CLOCK SIGNAL AND AN INTERNAL CLOCK SIGNAL

BACKGROUND OF THE INVENTION

1. Field of the Invention

The present invention relates to a semiconductor integrated circuit, and particularly to an internal clock generation circuit suitable for use in a synchronous semiconductor memory device activated in synchronism with a system clock.

2. Description of the Related Art

A semiconductor memory device operated in synchronism with a system clock supplied thereto has recently been required to speed up its operating speed with an increase in the frequency of the system clock. Therefore, a transfer delay time between the input of the system clock to the semiconductor memory device and the output of data therefrom becomes large relative to a clock cycle of the system clock. Thus, this leads to a malfunction.

FIG. 13(a) shows a data output-timing chart of a semiconductor memory device activated in synchronism with a system clock. The drawing shows the manner in which the system clock (hereinafter called "external clock $\Phi$ext") inputted to the semiconductor memory device is transferred within the semiconductor memory device with a delay time td0 and defined as a data output timing clock CLKd, and data $\Phi$out is outputted in synchronism with the clock. The data $\Phi$out is outputted with a delay dout of an output circuit with respect to the clock CLKd. The data is transmitted and received according to a strobe signal $\Phi$s.

When, however, the operating frequency of the external clock $\phi$ext becomes high, the strobe signal $\phi$s is outputted before the output of $\phi$out is fixed, so that a malfunction occurs.

In order to solve such a problem, an internal clock generation circuit such as Phase Locked Loop (PLL), Delay Locked Loop (DLL) employed in a semiconductor memory device has been proposed to implement chip's internal operations synchronized with a system clock.

FIG. 14 is a schematic diagram of a conventional internal clock generation circuit. The internal clock generation circuit comprises a delay line 102 for generating such amount of a delay thereof as to minimize the phase difference between an external clock $\Phi$ext and a data output $\Phi$out, a control circuit 200 for controlling the delay line 102, and a monitor circuit 106 for monitoring a delay amount of an output circuit 104 of a semiconductor memory device.

The control circuit 200 comprises a phase comparator 100 and a shift register 101. The phase comparator 100 compares the phase of the external clock next and that of a clock $\phi$fd, which is obtained by delaying an internal clock $\phi$int by a delay time dout of the output circuit 104 via the monitor circuit 106 and fed back from the monitor circuit 106 to thereby detect the phase difference therebetween and outputs a detected signal $\phi$1 to the shift register 101. The shift register 101 counts the detected signal $\phi$1 and outputs a control signal $\phi$2 to the delay line 102 in response to the detected signal $\phi$1 to control the delay line 102.

The delay line 102 is controlled according to the control signal $\phi$2 and controls or adjusts such a delay amount as to minimize the phase difference between the external clock $\phi$ext and the data output $\phi$out.

FIG. 16 is a data output timing chart of the circuit shown in FIG. 14. When the external clock $\phi$ext is inputted to the delay line 102, the amount of a delay of the delay line 102 is controlled by the control signal $\phi$2 so that such an internal clock $\phi$int that the delay amount tLine becomes tLine =tCK−dout (where tCK: cycle time of clock), is generated. It is therefore feasible to provide a data output $\phi$out minimized in delay with respect to the external clock $\phi$ext. Thus, the internal clock generation circuit generates such an internal clock $\phi$int as to achieve data output $\phi$out delayed by one cycle from the external clock $\phi$0ext.

FIG. 15 is a diagram showing a circuit configuration of the delay line 102 lying within the conventional internal clock generation circuit. As shown in FIG. 15, the delay line 102 comprises delay elements 202 and selects any of TAPs (TAP1 through TAPn) thereof in response to a control signal $\phi$2 to control the number of effective delay elements, thereby controlling or adjusting the amount of a delay of the external clock $\phi$ext. Incidentally, a unit delay time of each delay element 202 will be defined as a delay step.

However, the conventional internal clock generation circuit is accompanied by a problem in that since an internal clock generable frequency range is determined based on (delay step)×(number of delay elements), the number of the delay elements must be increased to generate the internal clock in a wide frequency range when the delay step is reduced, thus leading to an increase in chip area. When the operating frequency is 66 MHz, for example, the cycle time of a clock results in 15 ns. The number of the delay elements at the time that the delay step is 0.30 ns, needs 15÷0.30=50. Assuming that the delay step is set to 0.15 ns equivalent to one-half the delay step of 0.30 ns at this time, the number of the delay elements needs 100 equivalent to twice the number of the delay elements 50.

SUMMARY OF THE INVENTION

An object of the present invention is to provide an internal clock generation circuit capable of controlling an increase in chip area while reducing a delay step of a delay line and generating an internal clock in a wider frequency range.

In order to achieve the above object, there is provided an internal clock generation circuit according to the present invention, comprising a phase comparator, a shift register, a filter, a monitor circuit, and a plurality of delay lines such as first and second delay lines. The first delay line has delay steps each larger than that of the second delay line. The first delay line is first used to generate a clock minimized in phase difference with respect to an external clock. The clock signal is inputted to the second delay line to perform fine adjustment to the phase difference.

Typical ones of various inventions of the present application have been shown in brief. However, the various inventions of the present application and specific configurations of these inventions will be understood from the following description.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

DETAILED DESCRIPTION OF THE PREFERRED EMBODIMENTS

Preferred embodiments of the present invention will hereinafter be described in detail with reference to the accompanying drawings.

Figure 1:
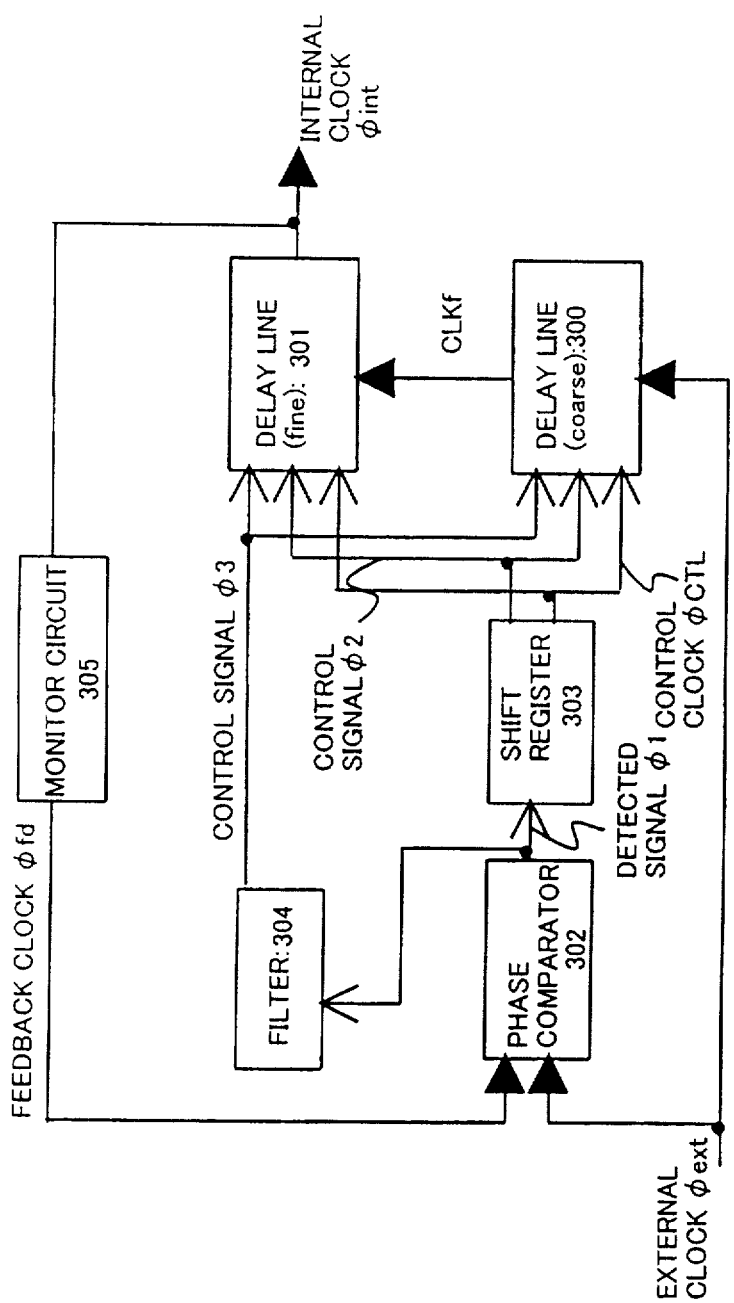
FIG. 1 is a block diagram showing a configuration of a first embodiment illustrative of an internal clock generation circuit according to the present invention.

FIG. 1 is a block diagram showing a first embodiment of an internal clock generation circuit according to the present invention. As shown in FIG. 1, the internal clock generation circuit comprises a phase comparator 302, a shift register 303, a filter 304, a monitor circuit 305, and a plurality of delay lines such as first and second delay lines 300 and 301.

The first and second delay lines 300 and 301 have different delay steps respectively. The first delay line 300 has delay steps each of which is larger than the delay steps of the second delay line 301.

The monitor circuit 305 monitors a delay dout developed from the reception of an internal clock $\phi$int by an output circuit of a semiconductor memory device to the output of a data output $\phi$out therefrom.

The phase comparator 302 compares the phase of an external clock $\phi$ext and that of a feedback clock $\phi$fd obtained by delaying the internal clock $\phi$int by dout through the monitor circuit 305 and outputs the result of comparison to the shift register 303 as a detected signal $\phi$1 indicative of whether the phase of the feedback clock $\phi$fd leads or lags that of the external clock $\phi$ext. The shift register 303 counts the detected signal $\phi$1 and outputs a control signal $\phi$2 for controlling the first delay line 300 and the second delay line 301.

The detected signal $\Phi$1 is also transmitted to the filter 304, where it latches the detected signal $\Phi$1 and outputs a control signal $\Phi$3 therefrom. When the control signal $\Phi$3 is now low in level, the first delay line 300 is selected and the amount of a delay of the first delay line 300 is controlled according to the control signal $\Phi$2. When the amount of delay is adjusted by the first delay line 300, and thereafter the phase comparator 302 detects an inability to control the delay amount any longer by the delay line 300 and transmits a detected signal $\Phi$1 indicative of the result of detection to the filter 304, the control signal $\Phi$3 is changed to an H(High) level to maintaining the amount of the delay of the first delay line 300, so that the internal clock generation circuit is locked. At this time, the second delay line 301 is selected and hence the control signal $\Phi$2 is selected so as to control the amount of a delay of the delay line 301.

Figure 2:
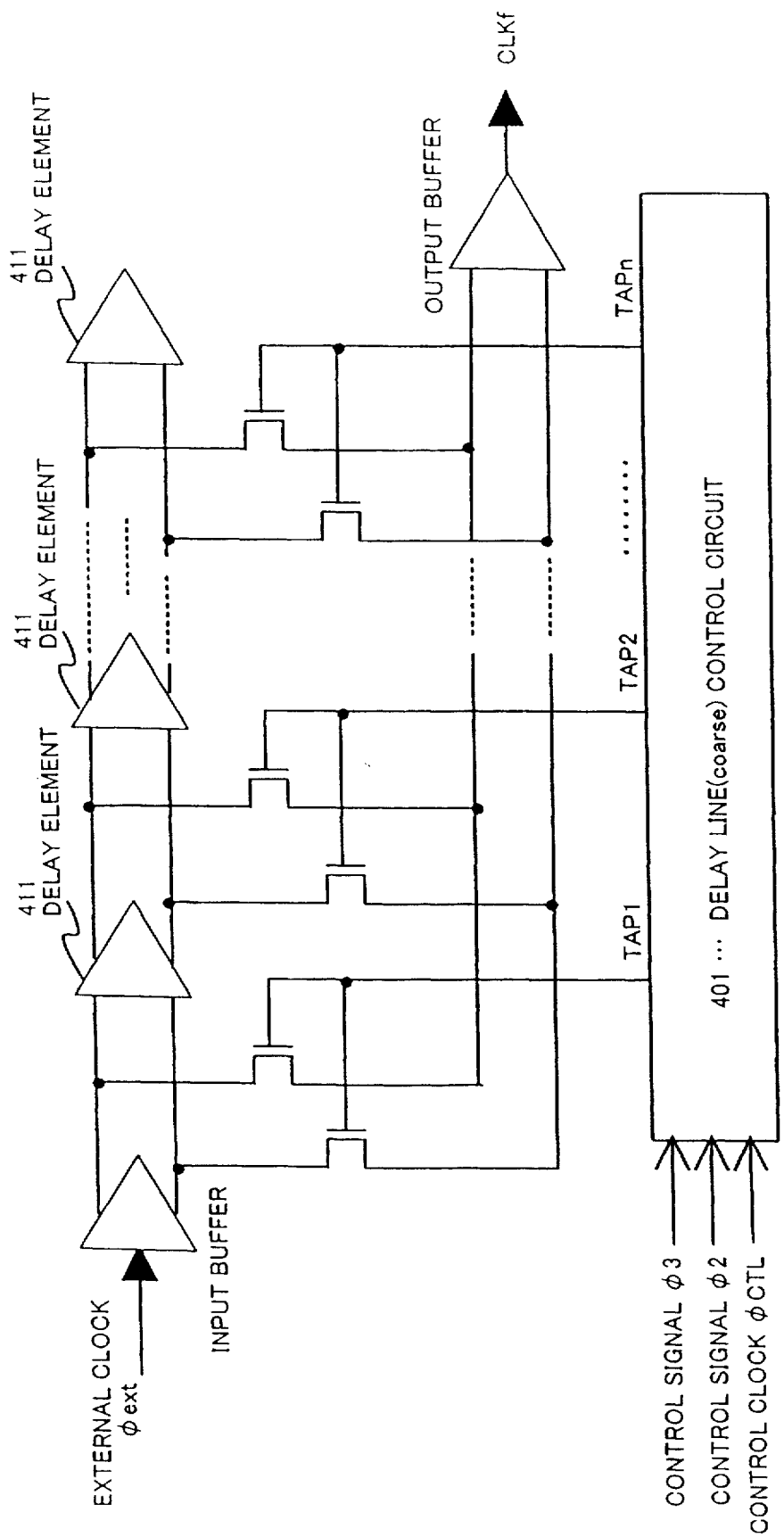
FIG. 2 is a diagram illustrating a configuration of a delay line (coarse) 300 employed in the first embodiment.

FIG. 2 is a diagram showing a circuit configuration of the first delay line 300. When a control signal $\Phi$3 is of an L(Low) level, a delay line control circuit 401 is controlled according to a control signal $\Phi$2 for controlling which TAP should be selected, and a control clock $\Phi$CTL used as a timing clock for selecting each TAP. Owing to the control of the delay line control circuit 401, the TAPs are selected one by one from a TAP1 to a TAP2, a TAP3, ... in order and thereafter brought to an H(High) level. When, for example, the selected TAP is a TAPm ($1 \leq m \leq n$), the number of effective delay elements results in m−1. When a delay step of each delay element 411 is tdc, the amount of the delay of the first delay line 300 results in tdc x (m−1). Namely, the external clock $\Phi$ext inputted to the first delay line 300 is delayed by tdc x (m−1) and outputted as CLKf. The CLKf is outputted as an internal clock $\Phi$int via the second delay line 301.

When the amount of the delay of the first delay line is adjusted so that the difference in phase between the external clock $\Phi$ext and the feedback clock $\Phi$fd is minimized, the control signal $\Phi$3 is rendered H(High) in level so that the delay line control circuit 401 is locked to maintain the amount of the delay thereof.

Figure 3:
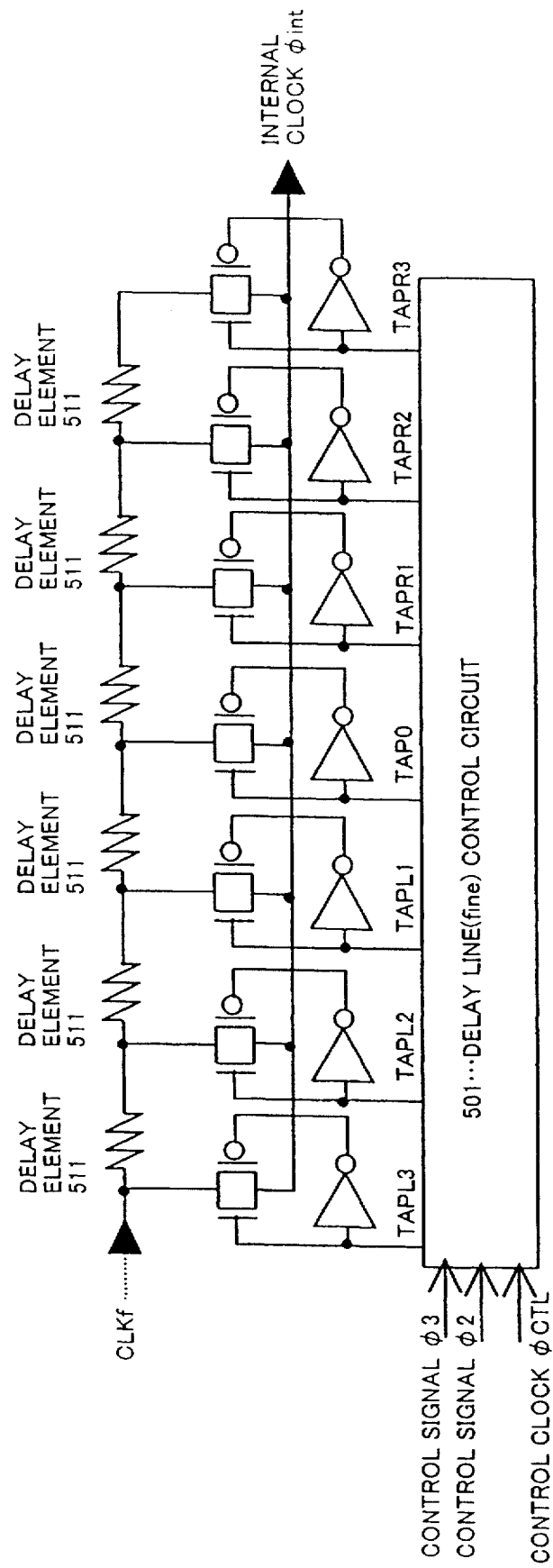
FIG. 3 is a diagram depicting a configuration of a delay line (fine) 301 employed in the first embodiment.

FIG. 3 is a diagram shown a circuit configuration of the second delay line 301. When a control signal $\Phi$3 is of an L(Low) level, a TAP0 corresponding to an intermediate TAP of the second delay line 301 is always maintained at an H(High) level by a delay line control circuit 501. When the control signal $\Phi$3 is brought to an H(High) level, the delay line control circuit 501 is controlled based on a control signal $\Phi$2 so that any one of the TAP0, TAPL1 through TAPL3 and TAPR1 through TAPR3 is selected and rendered H(High) in level. When the control signal $\Phi$2 is of the L(Low) level, the TAPs of the second delay line 301 are shifted in the left direction one step by one step to reduce the amount of a delay thereof. When the control signal $\Phi$2 is H(High) in level, the TAPs are shifted in the right direction to increase the amount of the delay thereof. Thus, when switching is done stepwise between the delay steps from the first delay line 300 larger in delay step, the second delay line 301 has such a configuration as to be able to increase or decrease the amount of the delay thereof.

Figure 4:
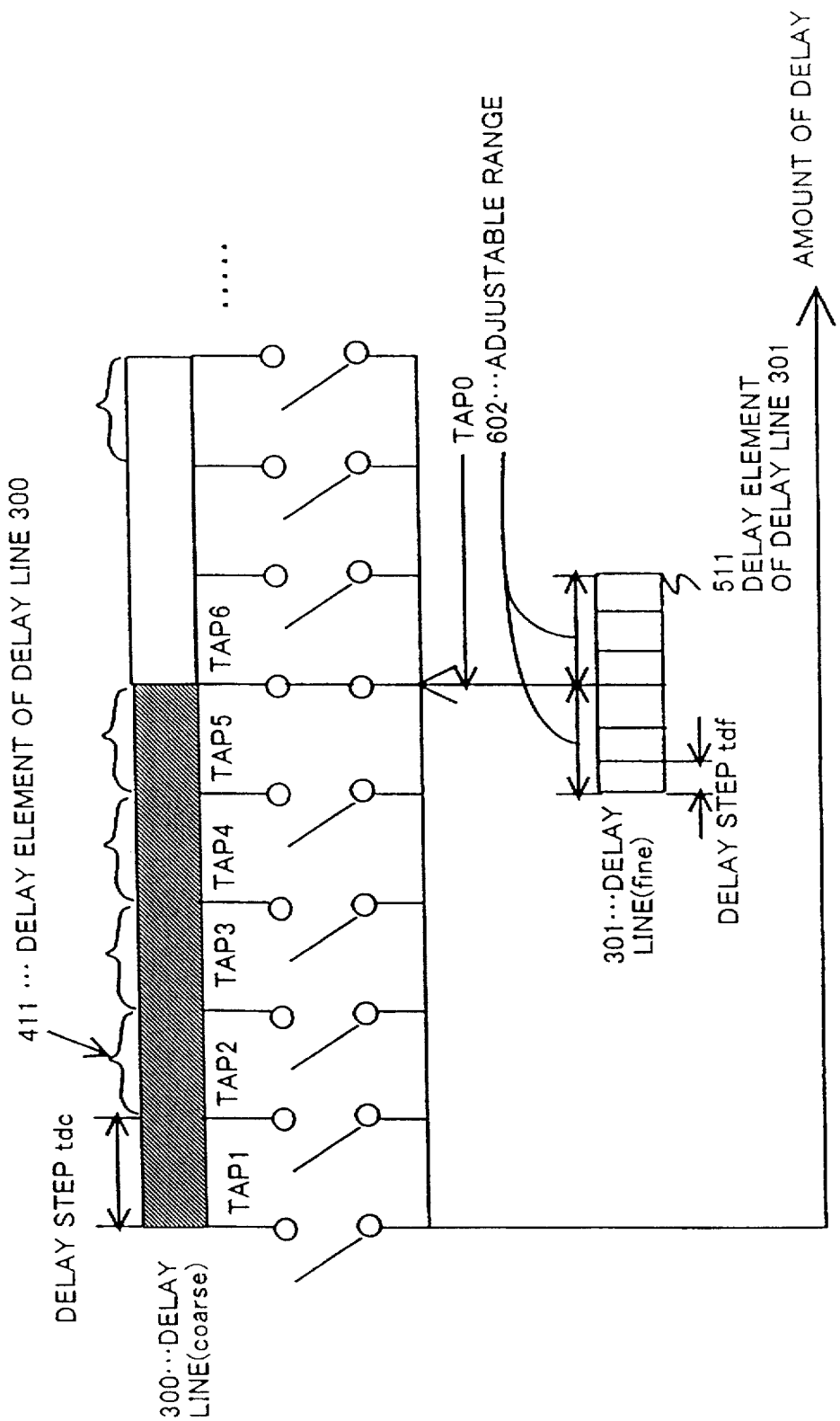
FIG. 4 is a diagram for describing adjustable ranges of the delay lines employed in the first embodiment.

FIG. 4 is a diagram for describing adjustable ranges of the first and second delay lines 300 and 301. As shown in FIG. 4, the relations in ($\frac{1}{2} \times n$)×tdf$\geq$tdc are established between each of delay steps tdc of the first delay line 300 and each of adjustable ranges 602 in which the amount of the delay of the second delay line 301 having smaller delay steps tdf can be increased or decreased. Incidentally, n is equivalent to the number of delay elements of the second delay line 301. In FIG. 4, n=6.

Owing to the above-described setting of adjustable ranges 602 in which the amount of the delay of the second delay line 301 can be increased or decreased, the delay amount maintained at the first delay line 300 can be controlled or adjusted finer.

Figure 5:
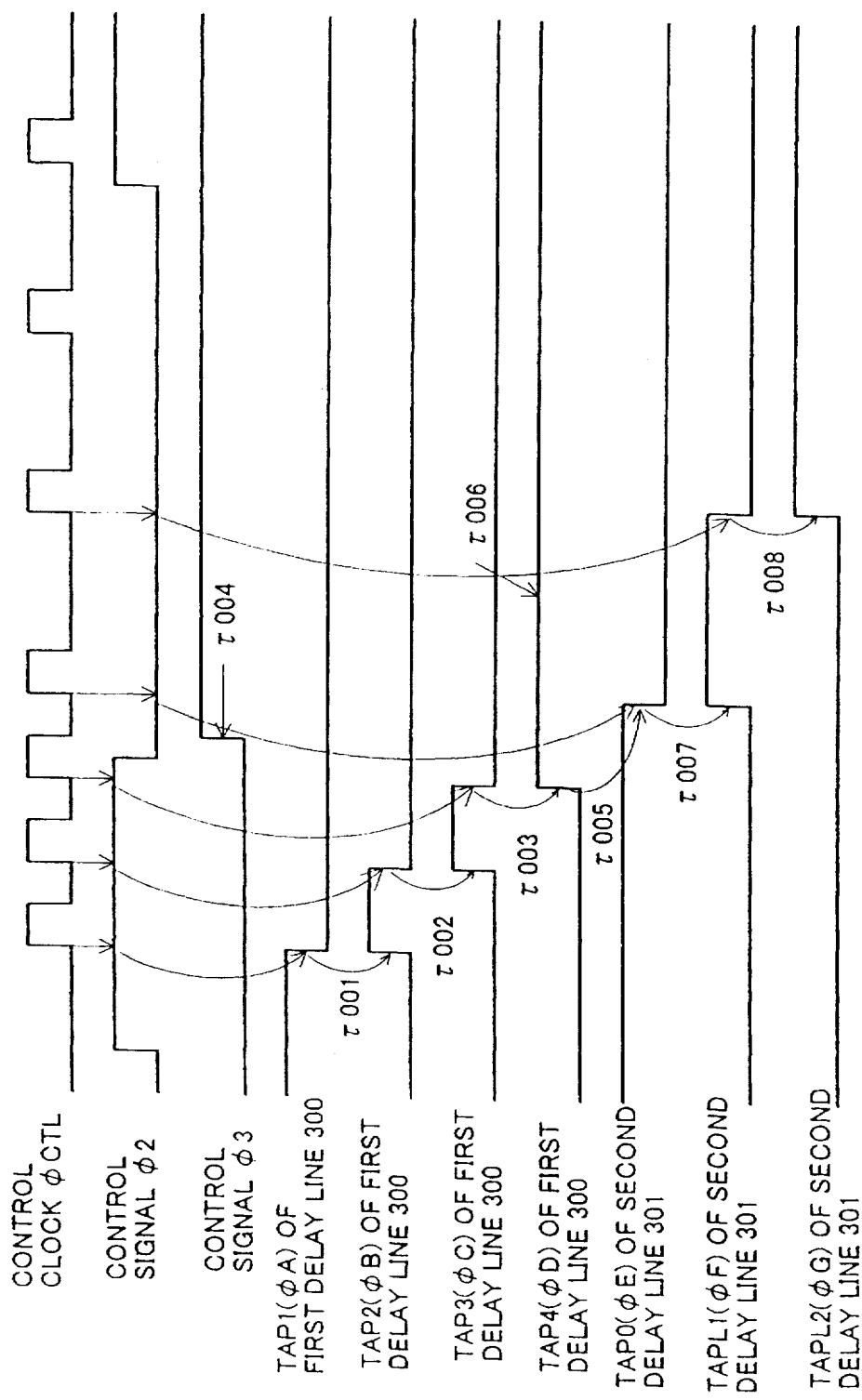
FIG. 5 is a timing chart for describing the operation of the first embodiment.

FIG. 5 is a timing chart for describing the operation of the internal clock generation circuit shown in FIG. 1. First, the shift register 303 outputs a control signal Φ2 in response to a detected signal Φ1 outputted from the phase comparator 302. In response to the control signal Φ2, the TAPs of the first delay line 300 are controlled stepwise in the direction to increase the delay amount thereof in synchronism with a control clock ΦCTL (τ001 through τ003). A control signal Φ3 outputted from the filter 304 is brought to an H(High) level according to the detected signal Φ1 so that the circuit is locked (τ004). Thus, the delay line controlled by the control signal Φ2 is changed over from the first delay line 300 whose delay steps are large, to the second delay line 301 whose delay steps are small (τ005). At this time, the TAP4 of the first delay line 300 is maintained at an H(High) level (τ006). Further, the TAPs of the second delay line 301 are controlled stepwise based on the control signal Φ2 (τ007 and τ008).

Under the above mentioned control method, the internal clock generation circuit according to the present embodiment generates an internal clock Φint obtained by performing fine adjustment to the difference in phase between the external clock Φext and the feedback clock Φfd owing to the stepwise switching from the first delay line 300 with coarse delay steps to the second delay line 301 with fine delay steps.

Figure 6:
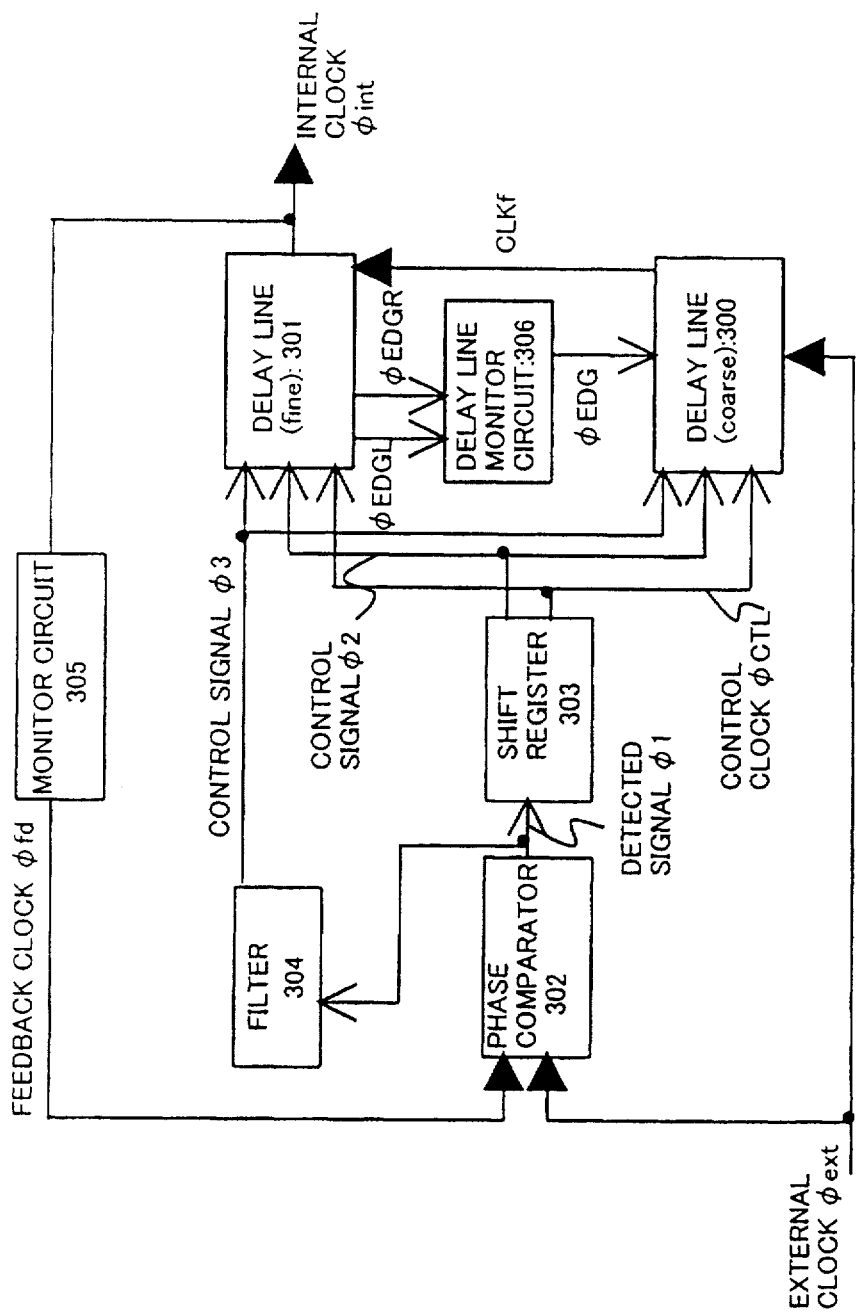
FIG. 6 is a block diagram showing a configuration of a second embodiment illustrative of an internal clock generation circuit according to the present invention.

FIG. 6 is a block diagram showing an internal clock generation circuit illustrative of a second embodiment of the present invention. The second embodiment is characterized in that the internal clock generation circuit according to the first embodiment is provided with a delay line monitor circuit 306. The delay line monitor circuit 306 monitors whether the corresponding amount of delay falls within each of adjustable ranges of a second delay line 301.

Figure 7:
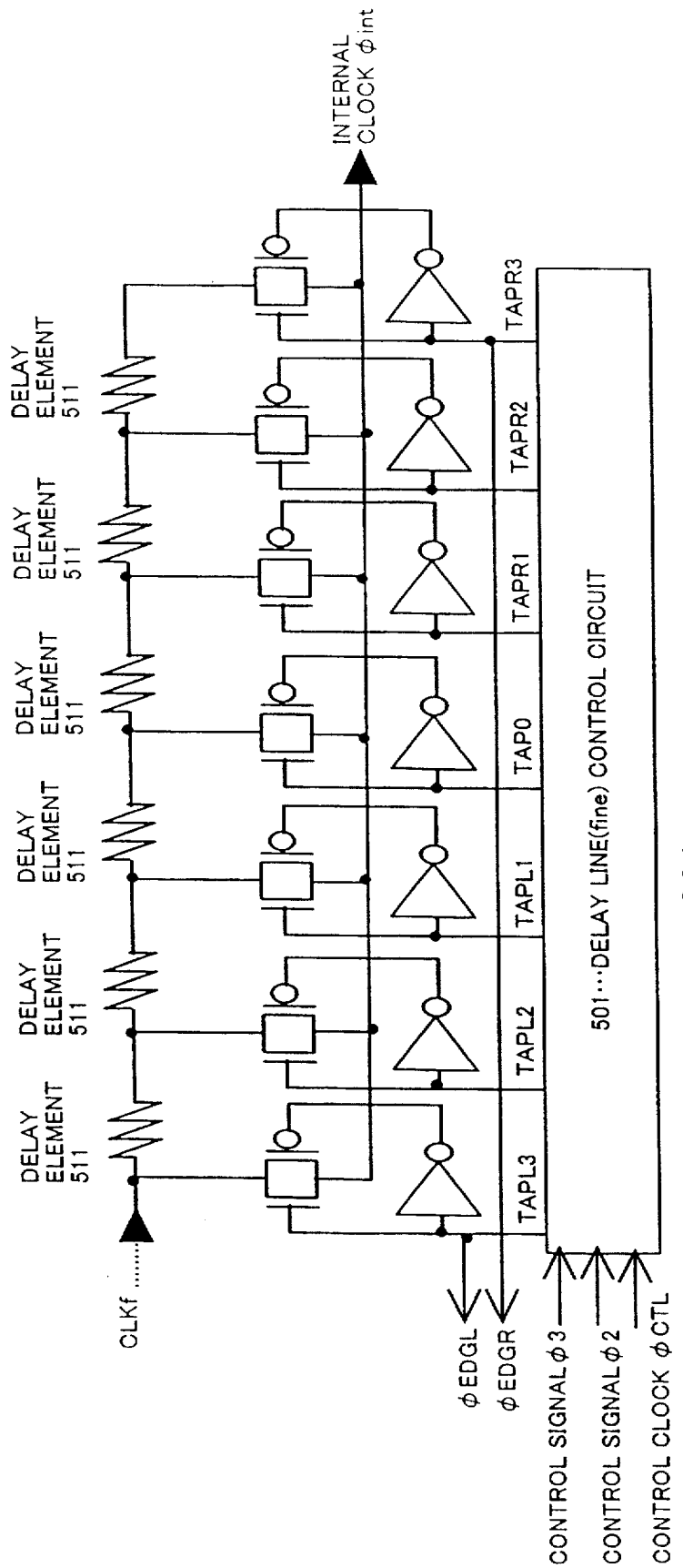
FIG. 7 is a diagram illustrating a configuration of a delay line (fine) 301 employed in the second embodiment.

FIG. 7 is a diagram illustrating a configuration of the delay line 301 with fine delay steps, which is employed in the second embodiment. In the second embodiment, ΦEDGR and ΦEDGL are added as signals for monitoring the TAPs at both ends, the TAPR3 and TAPL3 of the delay line 301 in the FIG. 3, which are employed in the first embodiment.

When the delay line 301 is controlled in the direction to increase the amount of a delay thereof in response to a control signal Φ2, i.e., the positions of the TAPs thereof are shifted to the right so that the TAPR3 is selected, ΦEDGR is brought to an H(High) level. Thus, the delay line 301 detects that the amount of the delay thereof has exceeded the adjustable ranges of the delay line 301. Similarly, when the delay line 301 is controlled in the direction to decrease the amount of the delay thereof in response to the control signal Φ2, i.e., the positions of TAPs are shifted to the left so that the TAPL3 is selected, ΦEDGL is brought to an H(High) level. Thus, the delay line 301 detects that the amount of the delay thereof has exceeded the adjustable ranges of the delay line 301.

The delay line monitor circuit 306 monitors based on the levels of ΦEDGR and ΦEDGL, whether the amount of the delay of the delay line 301 falls within a control range of the delay line 301. When either ΦEDGR or ΦEDGL corresponding to the signal for monitoring the delay line is brought to an H(High) level, the delay line monitor circuit 306 transmits to the delay line 301 that ΦEDG is rendered H(High) in level and hence the delay amount of the delay line 301 has exceeded the corresponding adjustable range of the delay line 301. When ΦEDG is brought to the H(High) level, the delay line 301 is reset so that the control signal Φ2 is switched to the delay line 300.

Figure 8:
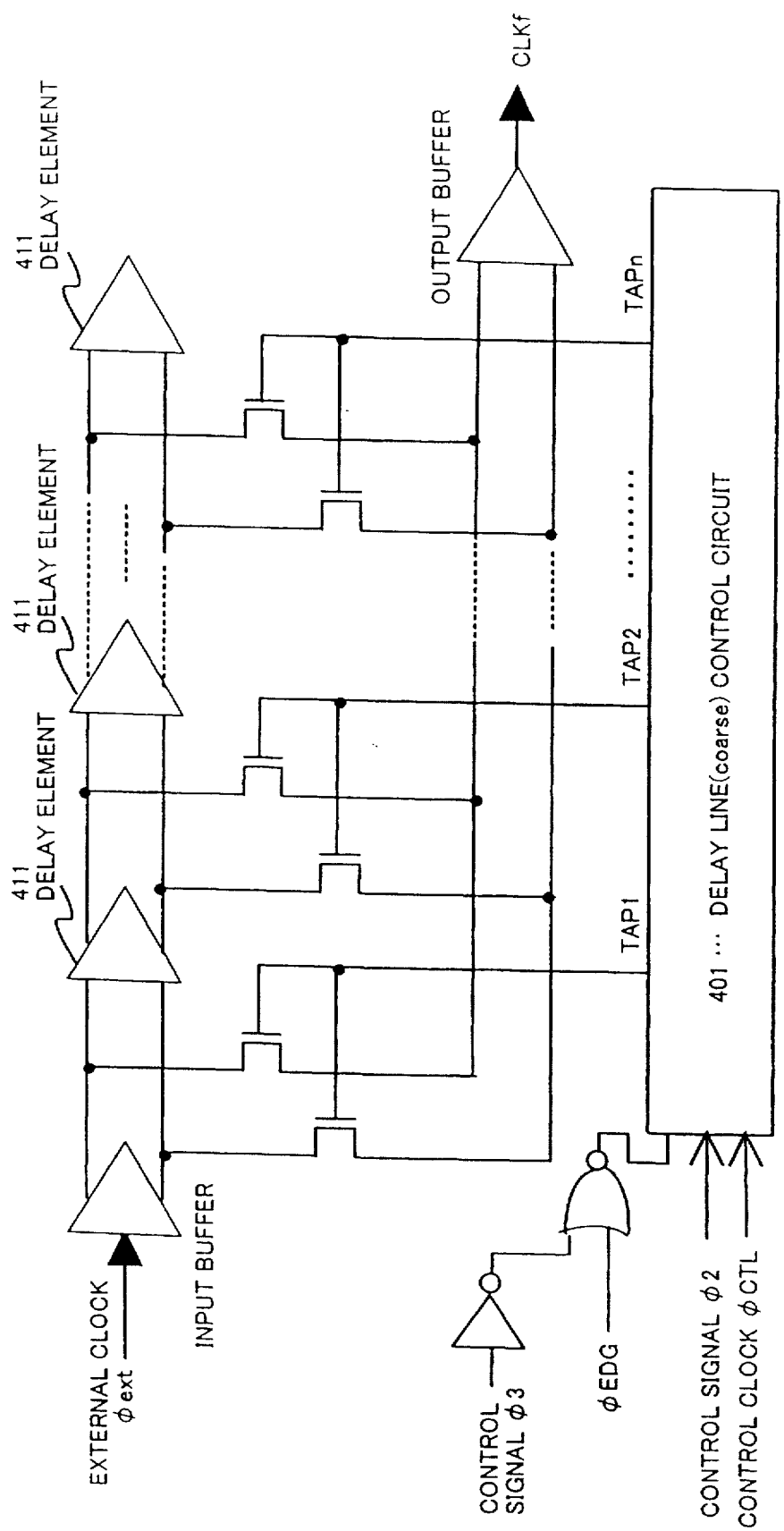
FIG. 8 is a diagram illustrating a configuration of a delay line (coarse) 300 employed in the second embodiment.

FIG. 8 is a diagram showing the delay line 300 with coarse delay steps, which is employed in the second embodiment. When the delay line 301 has exceeded the corresponding adjustable range as viewed in the direction to increase the amount of the delay thereof, the control signal Φ2 is changed from the delay line 301 with fine delay steps to the delay line 300 with coarse delay steps, so that the amount of the delay of the delay line 300 is increased by one step. Similarly, when the delay line 301 has exceeded the corresponding adjustable range as viewed in the direction to decrease the amount of the delay thereof, the control signal Φ2 is switched from the delay line 301 to the delay line 300, so that the delay amount of the delay line 300 is reduced by one step.

Figure 9:
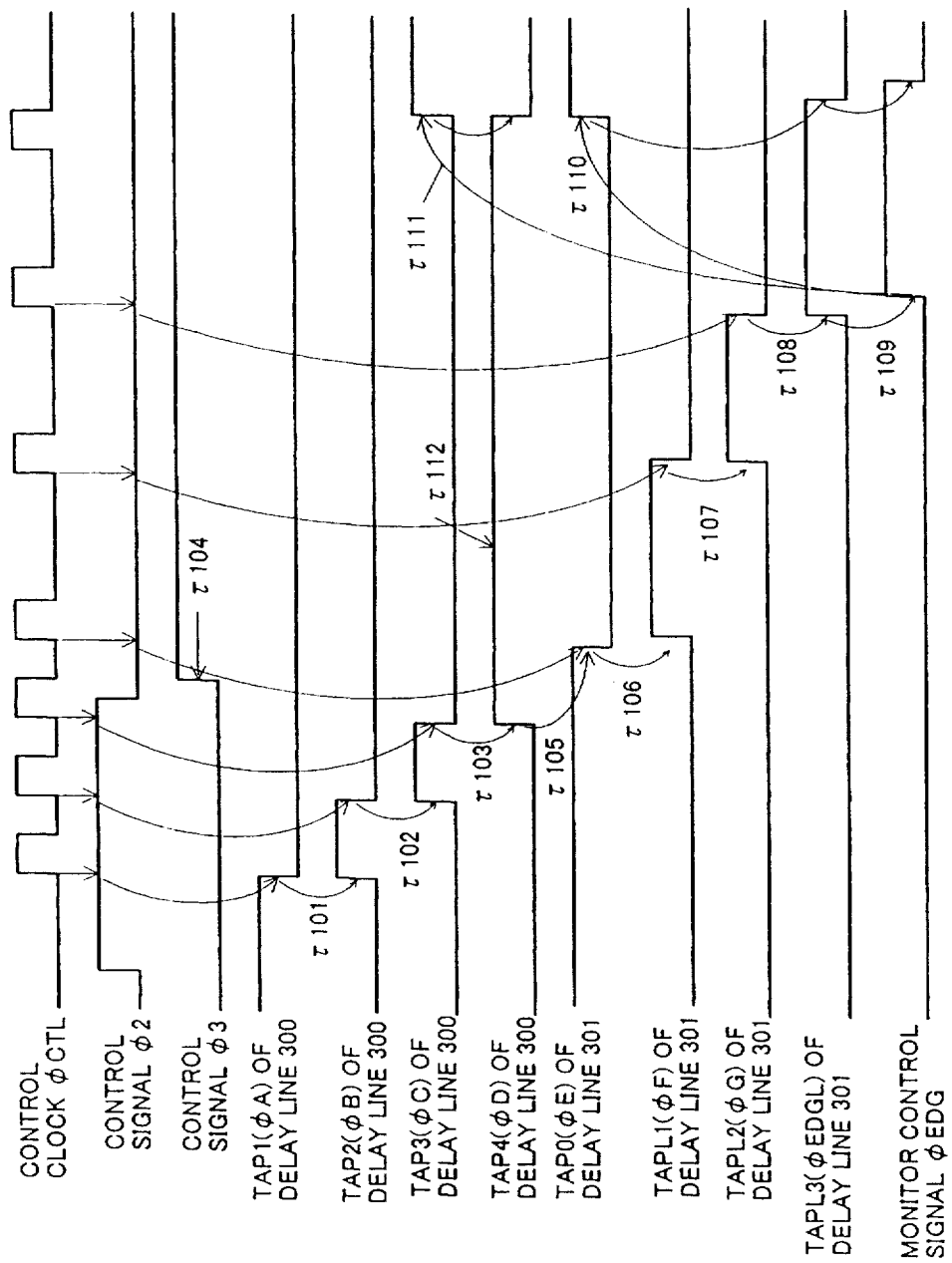
FIG. 9 is a timing chart (left shift) for describing the operation of the second embodiment.

FIG. 9 is a timing chart for describing the operation of the second embodiment. When the control signal Φ2 is H(High) in level, the TAPs, of the delay line 300 are controlled one step by one step in synchronism with a control clock ΦCTL (τ101 through τ103). When no phase difference is detected, the circuit is locked in response to a control signal Ω3 (τ104) so that the amount of the delay of the delay line 300 is held (τ112). Further, the control on the delay line is changed to the delay line 301 (τ105) so that the control signal Φ2 is transmitted to the delay line 301. When the amount of the delay of the delay line 301 is controlled, at each step in its decreasing direction according to the control signal Φ2 (τ106 through τ108) and ΦEDGL at the left end of the delay line 301 is brought to an H(High) level, the delay line monitor circuit 306 detects that the delay amount has exceeded the corresponding adjustable range of the delay line 301, and a monitor signal ΦEDG outputted from the delay line monitor circuit 306 is brought to an H(High) level (τ109). At this time, the delay line 301 is reset (τ110) so that the control signal Φ2 is changed to the delay line 300, whereby the retained level at a TAP4 (ΦD) is changed from H(High) to L(Low) and the level at a TAP3 (ΦC) is brought to an H(High) level (τ111). Accordingly, the delay amount of the delay line 300 is reduced by one step from the retained amount of delay.

Figure 10:
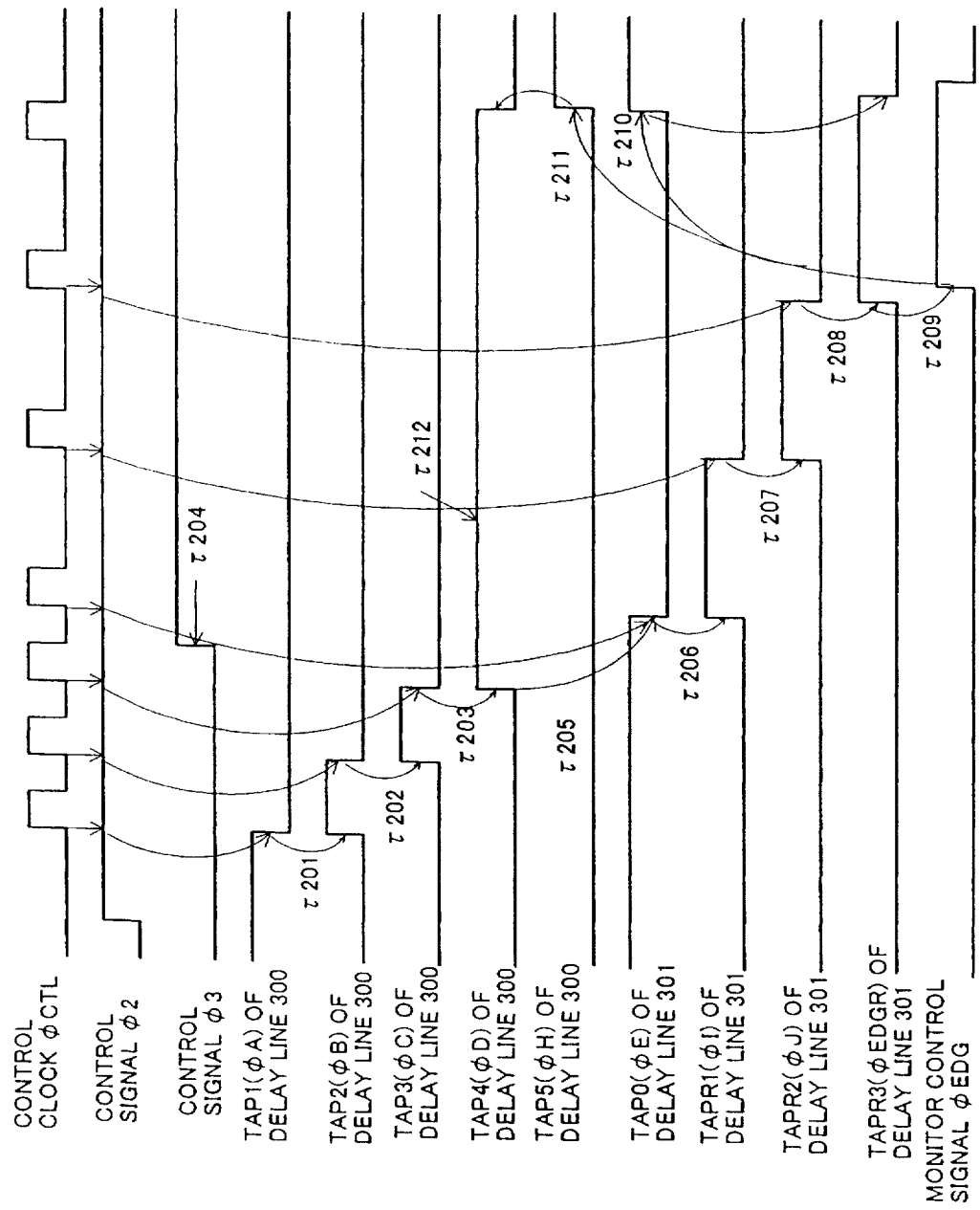
FIG. 10 is a timing chart (right shift) for describing another operation of the second embodiment.

FIG. 10 shows a timing chart for describing another operation of the second embodiment at the time that the delay amount of the delay line 301 shown in FIG. 9 is controlled in its increasing direction. When the delay line 300 is controlled based on a control signal Φ2 (τ201 through τ203) to lock the circuit (τ204), the amount of the delay of the delay line 300 is maintained and the control on the delay line is changed to the delay line 301 (τ205), so that the control signal Φ2 is transferred to the delay line 301. When the delay line 301 is controlled at each step in the direction to increase its delay amount in response to the control signal Φ2 (τ206 through τ208) and ΦEDGR at tile right end of the delay line 301 is brought to an H(High) level, the delay line monitor circuit 306 detects that the delay amount has exceeded the corresponding adjustable range, and a monitor signal ΦEDG outputted from the delay line monitor circuit 306 is brought to an H(High) level (τ209). At this time the delay line 301 is reset (τ210) so that the control signal Φ2 is changed to the delay line 300, whereby the retained level at the TAP4 (ΦD) is changed from H(High) to L(Low) and the level at a TAP5 (ΦH) is brought to an H(High) (τ211). As a result, the amount of the delay of the delay line 300 is increased by one step.

Figure 11:
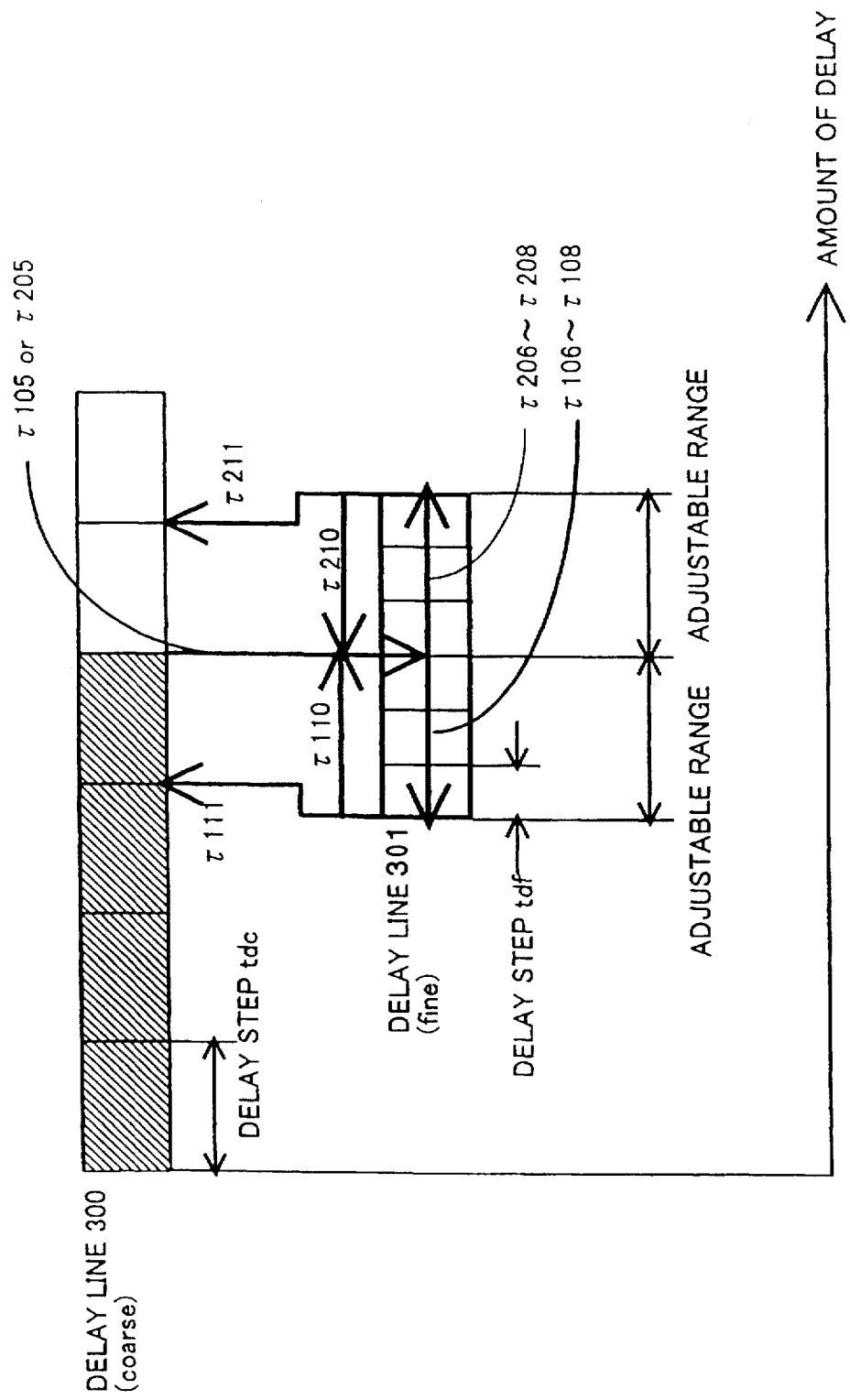
FIG. 11 is a diagram for describing a method of controlling the delay line employed in the second embodiment.

FIG. 11 is a diagram for describing the operation of the delay line 301 shown in FIGS. 9 and 10. The delay line 301 is switched from a circuit with coarse delay steps and a circuit with fine [small in] delay steps (τ105 and τ205). Thus, the delay line 301 is controlled according to the control signal Φ2 in the direction in which the amount of the delay of the delay line 301 increase (τ206 through τ208) or decreases (τ106 through τ108). When the delay amount exceeds an adjustable range as viewed in its increasing direction, the control signal Φ2 is changed from the delay line 301 to the delay line 300 so that the delay amount of the delay line 300 is incremented by one step (τ211). At this time, the delay line 301 is reset to the midpoint of the delay line (τ210). Similarly, when the delay amount exceeds an adjustable range as viewed in its decreasing direction (τ106 through τ108), the control signal Φ2 is changed from the delay line 301 to the delay line 300 so that the delay amount of the delay line 300 is decremented by one step (τ111). At this time, the delay line 301 is reset at the midpoint of the delay line (τ110).

Figure 12:
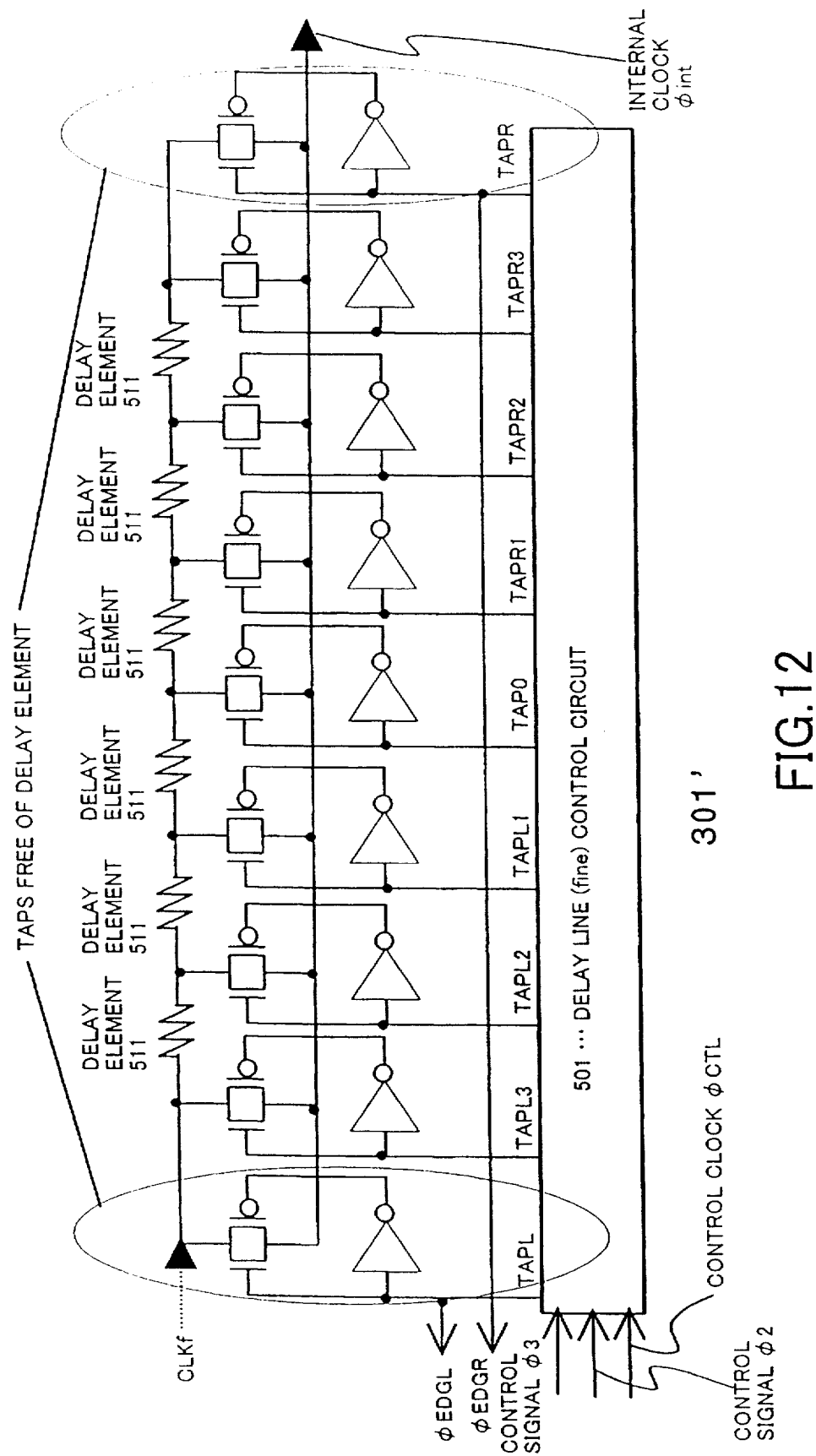
FIG. 12 is a configurational diagram showing a modification of the delay line 301 employed in the second embodiment.
Figure 13A:
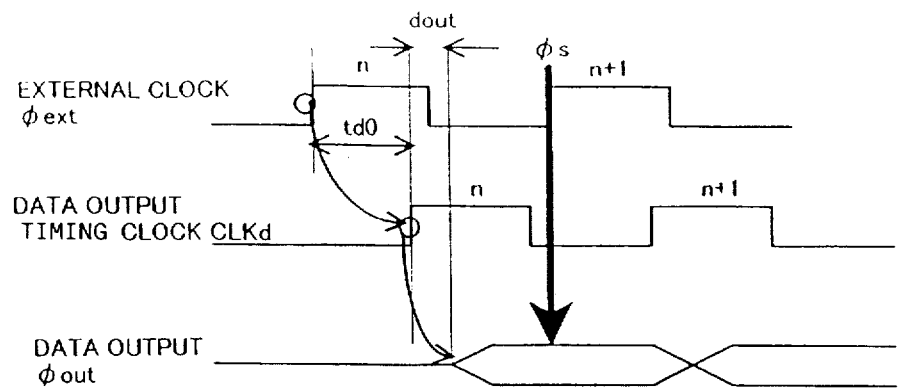
FIGS. 13A and 13B are data output timing charts employed in a prior art internal clock generation circuit.
Figure 13B:
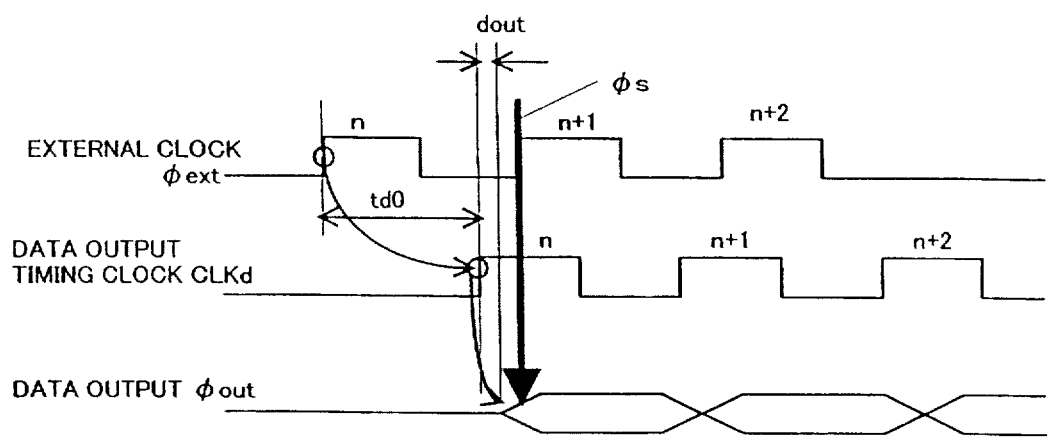
Figure 14:
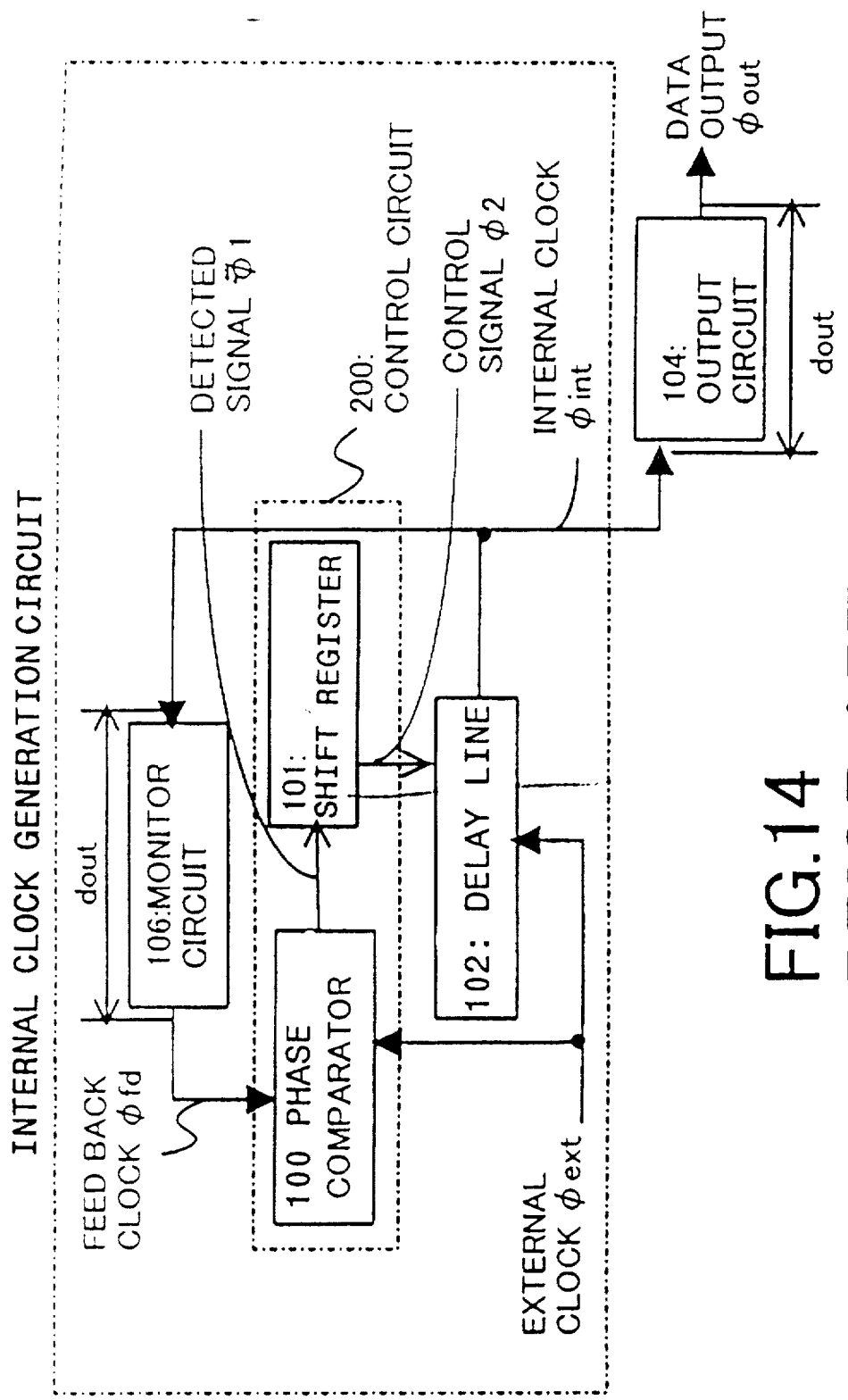
FIG. 14 is a schematic diagram of a conventional internal clock generation circuit.
Figure 15:
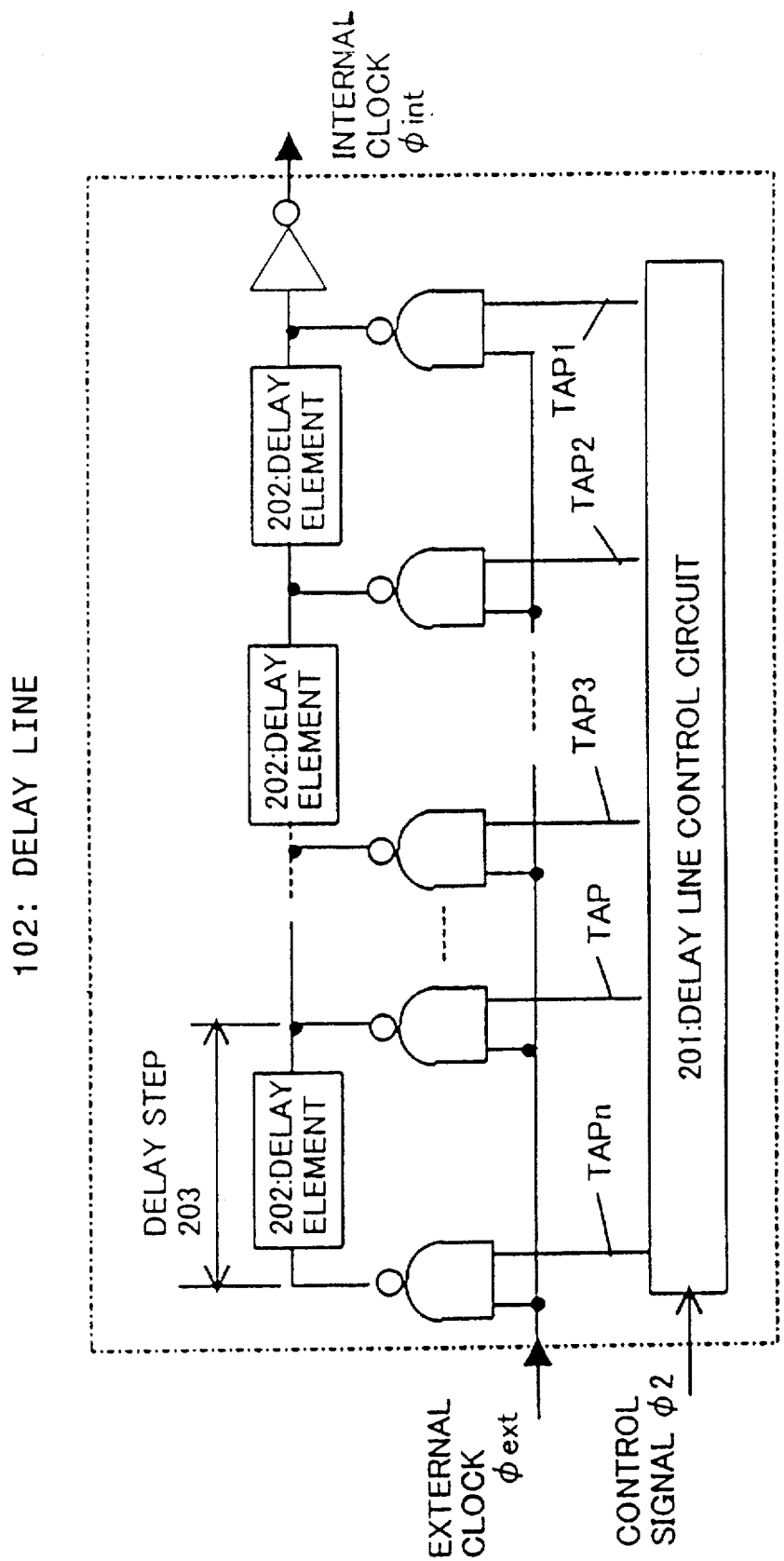
FIG. 15 is a diagram illustrating a circuit configuration of a conventional delay line 102.
Figure 16:
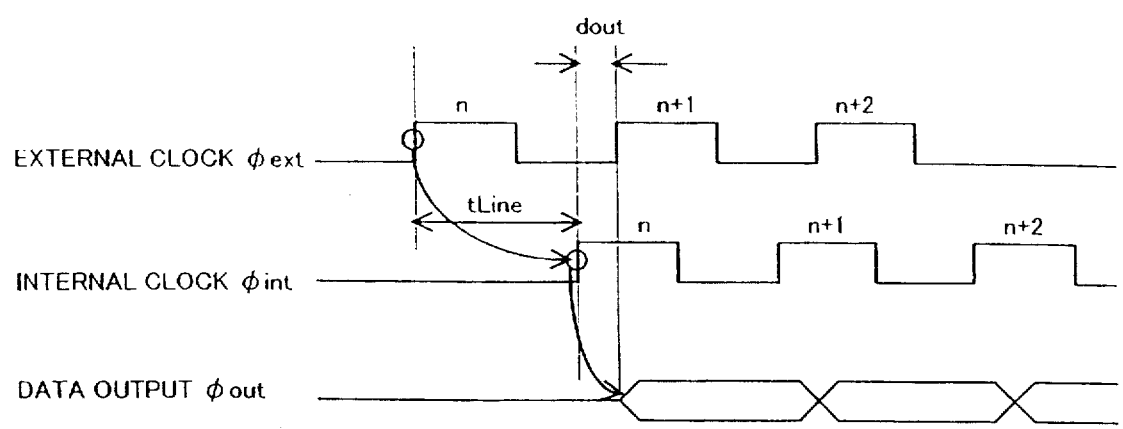
FIG. 16 is a data output timing chart of the circuit shown in FIG. 14.

FIG. 12 is a configurational diagram showing a modification 301' of the delay line 301 employed in the present embodiment. The delay line is one obtained by adding TAPs free of delay elements to both ends of the delay line 301 shown in FIG. 7. In the delay line 301' shown as the modification, TAPs are shifted to the right one step by one step in the direction to increase the amount of delay thereof according to a control signal Φ2 so that a TAPR3 at the right end of an adjustable range is selected. Further, a TAPR is selected only when the delay line is controlled in the direction to increase the delay amount by one step. Thus, ΦEDGR is brought to an H(High) level only when the TAPR is selected, so that the delay line 301' detects that the delay amount has exceeded the adjustable range as viewed in its increasing direction. Accordingly, the delay line 301' is reset so that the control signal Φ2 is changed to control the delay line 300.

In the delay line 301' in the same manner as described above, the TAPs are shifted to the left as viewed in the direction to decrease the delay amount according to the control signal Φ2 so that a TAPL3 at the left end of the adjustable range is selected. A TAPL is selected only when the delay line 301' is controlled based on the next control signal Φ2 in the direction in which the delay amount is further decreased by one step. Thus, ΦEDGL is brought to an H(High) level and hence the delay amount is maintained in the same state as when the TAPL3 is selected. Further, the delay line 301' detects that the delay amount thereof has exceeded the adjustable range as viewed in its decreasing direction.

Owing to the addition of the TAPs free of the delay elements to both ends in this way, the delay line 301 is not reset even when the TAPR3 or TAPL3 is selected. It is therefore possible to hold the delay amounts of the delay element at the TAPR3 or TAPL3.

According to the internal clock generation circuit according to the present invention as described above, a plurality of delay lines respectively having different delay steps are provided. The delay lines with coarse delay steps are first adjusted in delay amount and the delay lines with fine delay steps are further adjusted in delay amount. It is therefore possible to improve the accuracy of phase adjustment and generate an internal clock small in phase difference with respect to the external clock.

Further, when the operating frequency is set to 66 MHz and the delay step is changed from 0.30 ns (number of delay elements=15÷0.30=50) to 0.15 ns (number of delay elements=15÷0.15=100), i.e., when the length of a delay step is decreased by half in the conventional internal clock generation circuit provided with one delay line, the number of delay elements are doubled and hence, in this instance, the number of the delay elements is increased by 50. In the internal clock generation circuit according to the present invention, however, the conventional delay line having the above-described delay step of 0.30 ns is used as the course delay line 300 having a relative large number of delay steps and the fine delay line having a relatively small number of delay steps is simply provided with six delay elements in total, each having a delay step of 0.15 ns, three delay elements in the increasing direction and three delay elements in the decreasing direction. Consequently, the internal clock generation circuit according to the present invention can obtain an effect similar to the above and keep an increase in its area to a minimum.

While the present invention has been described with reference to the illustrative embodiments, this description is not intended to be construed in a limiting sense. Various modifications of the illustrative embodiments, as well as other embodiments of the invention, will be apparent to those skilled in the art on reference to this description. It is therefore contemplated that the appended claims will cover any such modifications or embodiments as fall within the true scope of the invention.

What is claimed is:

1. An internal clock generation circuit that minimizes a phase difference between an internal clock signal and an external clock signal, comprising:

a plurality of delay lines with differing delay amounts, each of said delay lines providing one of the delay amounts in response to a control signal, said delay lines being selected in response to a selection signal;

a monitoring circuit connected to said plurality of delay lines, said monitoring circuit generating a feedback clock signal in response to the internal clock signal, the feedback clock signal being delayed with a predetermined delay time from the internal clock signal;

a phase comparator connected to said monitoring circuit, said phase comparator detecting a phase difference between the feedback clock signal and the external clock signal and generating a detected signal in response to the phase difference;

a shift register connected to said phase comparator and said plurality of delay lines, said shift register generating the control signal in response to the detected signal; and a filtering circuit connected to said delay lines and said phase comparator, said filtering circuit generating the selection signal in response to the detected signal.

2. The internal clock generating circuit of claim 1, wherein said plurality of delay lines includes a coarse delay line for delaying a signal with coarse delay steps and a fine delay line for delaying a signal with fine delay steps.

3. The internal clock generating circuit of claim 1, wherein a delay amount of the fine delay line is initially set to a center of a variable delay range thereof, and the delay amount of the fine delay line is adjusted by the control signal.

4. The internal clock generating circuit of claim 2, further comprising:

a delay line monitoring circuit connected to said plurality of delay lines for determining whether the delay amount of each of said plurality of delay lines exceeds an adjustable range of the respective delay line, and wherein when said monitoring circuit determines that the delay amount of the fine delay line exceeds the adjustable range of the fine delay line, the coarse delay is changed by one step.

5. The internal clock generating circuit of claim 4, wherein the adjustable range of the fine delay line is greater than one step of the coarse delay.

6. The internal clock generating circuit of claim 1, wherein the predetermined delay time is determined by measuring a delay time of the internal clock signal.

7. An internal clock generating circuit minimizing a phase difference between an internal clock signal and an external clock signal, comprising:

a first delay circuit receiving the external clock signal, said first delay circuit delaying the external signal by a predetermined number of times of a first delay amount in response to a first control signal and Outputting a delayed signal, said first delay circuit being selected in response to a second control signal;

a second delay circuit coupled to said first delay circuit for receiving the delayed signal from the first delay circuit, said second delay circuit delaying the delayed signal of the first delay circuit by a predetermined number of times of a second delay amount that is smaller than the first delay amount in response to the first control signal and outputting the internal clock signal, said second delay circuit being selected in response to a second control signal;

an internal clock feedback circuit coupled to said second delay circuit for generating a feedback clock signal in response to the internal clock signal;

a phase comparator coupled to said internal clock feedback circuit for receiving the external clock signal, said phase comparator detecting a phase difference between the feedback clock signal and the external clock signal and generating a detected signal in response to the phase difference;

a count circuit coupled to said phase comparator and to said first and second delay circuits for generating the first control signal in response to the detected signal; and a filtering circuit coupled to said phase comparator and to said first and second delay circuits for generating the second control signal in response to the detected signal.

8. An internal clock generating circuit according to claim 7, wherein the internal clock feedback circuit delays the internal clock signal to generate the feedback clock signal.

9. An internal clock generating circuit according to claim 7, wherein the first delay circuit includes a plurality of delay elements connected in series;

an output buffer for Outputting the delayed signal;

a plurality of switching circuits, each of which is connected to a respective one of the plurality of delay elements and to the output buffer, each of the plurality of switching circuits being controlled by a third control signal; and a first delay line control circuit connected to the plurality of switching circuits.

10. An internal clock generating circuit according to claim 7, wherein the second delay circuit includes a plurality of delay elements connected in series;

an output buffer for Outputting the internal clock signal;

a plurality of switching circuits, each of which is connected to a respective one of the plurality of delay elements, each of the plurality of switching circuits being controlled by the third control signal; and a second delay line control circuit connected to the plurality of switching circuits.

11. An internal clock generating circuit according to claim 7, further comprising a delay line monitoring circuit connected to said first and second delay circuits for making a determination of whether the delay amount of said second delay circuit exceeds an adjustable range thereof, and outputting a fourth control signal to said first delay circuit in response to said determination.

12. An internal clock generating circuit according to claim 11, wherein said first delay circuit changes delay time with the first delay amount in response to the fourth control signal.

13. An internal clock generating circuit according to claim 7, wherein said count circuit is a shift register.

* * * * *